United States Patent
Kim et al.

(10) Patent No.: US 8,994,169 B2
(45) Date of Patent: Mar. 31, 2015

(54) SEMICONDUCTOR PACKAGES USABLE WITH A MOBILE DEVICE

(75) Inventors: Ji-Chul Kim, Yongin-si (KR); Jin-Kwon Bae, Hwaseong-si (KR); Mi-Na Choi, Seoul (KR); Hee-Jung Hwang, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 282 days.

(21) Appl. No.: 13/597,628

(22) Filed: Aug. 29, 2012

(65) Prior Publication Data
US 2013/0135823 A1 May 30, 2013

(30) Foreign Application Priority Data
Nov. 28, 2011 (KR) .................. 10-2011-0124840

(51) Int. Cl.
*H01L 23/34* (2006.01)
*H01L 23/467* (2006.01)
*H05K 7/20* (2006.01)
*F28F 7/00* (2006.01)

(52) U.S. Cl.
CPC .......... *H01L 23/467* (2013.01); *H05K 7/20136* (2013.01)
USPC ...... 257/721; 257/713; 361/695; 361/679.46; 165/80.2; 438/122; 700/300

(58) Field of Classification Search
CPC ... H05K 7/20136; H01L 23/40; H01L 23/467
USPC ........................ 361/679.46–679.54, 688–723; 165/80.2–80.3; 257/712–713, 721; 174/16.1, 547–548; 438/122
See application file for complete search history.

(56) References Cited

U.S. PATENT DOCUMENTS

| | | | | |
|---|---|---|---|---|
| 5,629,560 | A * | 5/1997 | Katsui et al. | 257/712 |
| 5,981,929 | A | 11/1999 | Maeda et al. | |
| 6,219,236 | B1 * | 4/2001 | Hirano et al. | 361/695 |
| 6,813,153 | B2 * | 11/2004 | Koning et al. | 361/700 |
| 7,038,911 | B2 * | 5/2006 | Foster et al. | 361/695 |
| 7,092,254 | B1 * | 8/2006 | Monsef et al. | 361/699 |
| 8,680,672 | B2 * | 3/2014 | Tseng | 257/712 |
| 2003/0039545 | A1 | 2/2003 | Hirata | |
| 2005/0231914 | A1 | 10/2005 | Mikubo et al. | |

FOREIGN PATENT DOCUMENTS

| | | |
|---|---|---|
| JP | 2000-232290 | 8/2000 |
| JP | 3781018 | 3/2006 |
| JP | 4640429 | 12/2010 |

\* cited by examiner

*Primary Examiner* — Zachary M Pape
(74) *Attorney, Agent, or Firm* — Ellsworth IP Group PLLC

(57) ABSTRACT

A semiconductor package usable with a mobile device includes a circuit board including conductive wirings therein and contact terminals on a rear surface thereof, an integrated circuit chip positioned on a front surface of the circuit board and electrically connected to the conductive wirings, a cover including at least an opening, and to cover the integrated circuit chip such that a flow space is provided around the integrated circuit chip and the opening communicates with the flow space, and an air flow generator positioned on the cover to generate a compulsory air flow through the flow space and the opening, thereby dissipating heat out of the semiconductor package from the integrated circuit chip by the compulsory air flow.

21 Claims, 5 Drawing Sheets

SEMICONDUCTOR PACKAGES USABLE WITH A MOBILE DEVICE

CROSS-REFERENCE TO RELATED APPLICATIONS

This application claims the priority under 35 U.S.C. 119 from Korean Patent Application No. 10-2011-0124840 filed on Nov. 28, 2011 in the Korean Intellectual Property Office, the disclosure of which is incorporated herein in its entirety by reference.

BACKGROUND

1. Field

Example embodiments relate to a semiconductor package, and more particularly, to a semiconductor package usable with a mobile device having a heat radiator.

2. Description of the Related Art

Generally, semiconductor chips are usually manufactured on a semiconductor substrate such a wafer through various unit semiconductor manufacturing processes and each of the semiconductor chips is separated from the wafer and is packaged into a semiconductor package through a semiconductor package process. The semiconductor package is mounted on a base substrate such as a printed circuit board (PCB) in which electronic circuit patterns are prepared, to thereby form various semiconductor modules for electronic appliances.

As the recent electronic appliances tend to be downsized with high performance, the semiconductor module for the electronic appliances is also downsized with high speed, high performance and high degree of integration. A flip chip configuration and a solder ball structure have been suggested for downsizing the semiconductor package and various stack packages have been provided for increasing the performance of the semiconductor package.

However, when the high integrated semiconductor chips or the packages are operated at high speed with high performance, a large amount of heat may be generated from each chip of the packages and thus the packages and the electronic appliances including the packages may be malfunctioned due to the deterioration of the packages or the chips caused by the heat. For those reasons, various researches on heat dissipation from the semiconductor package have been conducted for a long time. For example, various dissipation members, such as a heat sink and a heat spread, are arranged in the electronic appliances including the semiconductor packages.

However, the conventional heat dissipation members have many difficulties in dissipating heat from recent small semiconductor packages for a mobile device due to small form factor of the mobile device. For example, the conventional heat cooler does not sufficiently dissipate heat outwards from an application processor (AP) in a smart phone or a table PC.

The conventional dissipation member usually dissipates heat from surfaces thereof to surrounding air based on natural convection theory and thus the dissipation capacitance is usually proportional to the size of the surface of the dissipation member and as a result, proportional to the size of the semiconductor package. The recent electronic appliances tend to be downsized due to the trend of the small form factor and thus the surfaces of the dissipation member installed in the electronic appliances also tend to be decreased, which finally deteriorate the dissipation capacitance of the dissipation member. In contrast, the amount of the heat generated from the electronic appliances tends to increase due to the high performance and speed of the electronic appliances. For those reasons, the heat generated from the recent small semiconductor packages for mobile devices cannot be sufficiently dissipated by the passive dissipation of the conventional dissipation member based on the natural convection.

Further, the dissipation members for the active dissipation such as a large-sized cooling fan usually occupy a large space in the electronic appliances, compared to the small form factor of the electronic appliances.

Accordingly, there is still a need for an improved semiconductor package for mobile devices from which the heat is efficiently dissipated.

SUMMARY

Example embodiments of the present inventive concept provide a semiconductor package usable with a mobile device from which heat is dissipated by forced convection.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a semiconductor package usable with a mobile device. The semiconductor package usable with a mobile device may include a circuit board including conductive wirings therein and contact terminals on a rear surface thereof, an integrated circuit chip positioned on a front surface of the circuit board and electrically connected to the conductive wirings, a cover including at least an opening and to cover the integrated circuit chip such that a flow space is provided around the integrated circuit chip and the opening communicates with the flow space, and an air flow generator positioned on the cover to generate a compulsory air flow through the flow space and the opening, thereby dissipating heat out of the semiconductor package from the integrated circuit chip by the compulsory air flow.

The integrated circuit chip may include a flip chip structure in which an active surface of the integrated circuit chip faces a front surface of the circuit board and an electrode pad on the active surface of the integrated circuit chip is connected to the conductive wirings on the front surface of the circuit board by a ball grid array (BGA) and may further include a dissipater interposed between the integrated circuit chip and the cover.

The cover may include first and second openings through which surrounding air flows into or out of the flow space and the air flow generator is positioned on one of the first and second openings.

The air flow generator may include a rotary fan, a rotary blower or a piezoelectric blower.

The semiconductor package may further include an adhesive interposed between the integrated circuit chip and the cover such that the dissipater is positioned in the adhesive.

The semiconductor package may include a control program that is activated at a surface temperature of the integrated circuit chip with respect to a reference temperature is embedded into the integrated circuit chip, and a controller driven by the control program and installed to the air flow generator such that the air flow generator is controlled to be operated when the surface temperature of the integrated circuit chip is higher than the reference temperature.

The foregoing and/or other features and utilities of the present general inventive concept may also be achieved by providing a semiconductor package usable with a mobile device. The semiconductor package usable with a mobile device may include a first package including a first circuit board having first conductive wirings, a first integrated circuit chip on a front surface of the first circuit board and a contact terminal on a rear surface of the first circuit board, the first integrated circuit chip and the contact terminal being connected to the first conductive wirings; a second package spaced apart from the first package to thereby provide a gap space therebetween and including a second circuit board having second conductive wirings and a second integrated circuit chip on a front surface of the second circuit board, the second integrated circuit chip being connected to the second conductive wirings, an air flow generator to generate a compulsory air flow through the gap space, and a flow guide positioned at a first side of the first and the second packages to guide the compulsory air flow to a desired direction.

The first integrated chip may include an application processor to operate instructions and to process data, and the second integrated chip may include a memory chip to store the data processed in the application processor.

The first and the second integrated chips may include a plurality of chips, respectively, so that the first and the second packages include a multi stack package, respectively.

The air flow generator may be positioned on the second package, and the flow guide may include a vertical portion that may be spaced apart from the first side of the first and the second packages to thereby form a side space therebetween and a horizontal portion that may extend horizontally toward the air flow generator to thereby form an upper space US between the horizontal portion and the second package.

The air flow generator may include a rotary fan, a rotary blower or a piezoelectric blower.

The flow guide may include a metal plate having high thermal conductivity.

The metal plate may include any one material selecting from a group consisting of aluminum (Al), copper (Cu) and combinations thereof.

The semiconductor package may further include at least a connection terminal to make contact with both of the first conductive wirings and the second conductive wirings through the gap space.

The semiconductor package may further include a control program that is activated at a surface temperature of the first integrated circuit chip with respect to a reference temperature and that is embedded into the first integrated circuit chip, and a controller driven by the control program and installed to the air flow generator such that the air flow generator is controlled to be operated on condition that the surface temperature of the first integrated circuit chip is higher than the reference temperature.

The foregoing and/or other features and utilities of the present general inventive concept may also be achieved by providing a semiconductor package usable with a mobile device, the semiconductor package including a package including a circuit board having conductive wirings, an integrated circuit chip on a front surface of the circuit board, a contact terminal on a rear surface of the circuit board, the integrated circuit chip and the contact terminal being connected to the conductive wirings, and a cover disposed to cover the integrated circuit chip and to form a gap space therebetween, and an air flow generator disposed to generate a compulsory air flow through the gap space in the package.

The cover may include one or more securing portions disposed on the circuit board, one or more supports extended from the corresponding securing portions away from the circuit board, and a plate connected to the supports to cover the integrated circuit chip and having at least one opening, and the air flow generator may be disposed on the airflow to communicate with the opening.

The semiconductor package may further include a flow guide positioned at a side of the packages to guide the compulsory air flow to a direction of the semiconductor package, and the flow guide may include a conductive material to transfer heat generated from the package to an outside thereof.

The semiconductor package may further include a program control unit disposed in at least one of the circuit board and the integrated circuit chip to generate a control signal, and a controller disposed in the air flow generator to receive the control signal to control an operation of the air flow generator.

The foregoing and/or other features and utilities of the present general inventive concept may also be achieved by providing a mobile device having the semiconductor package.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
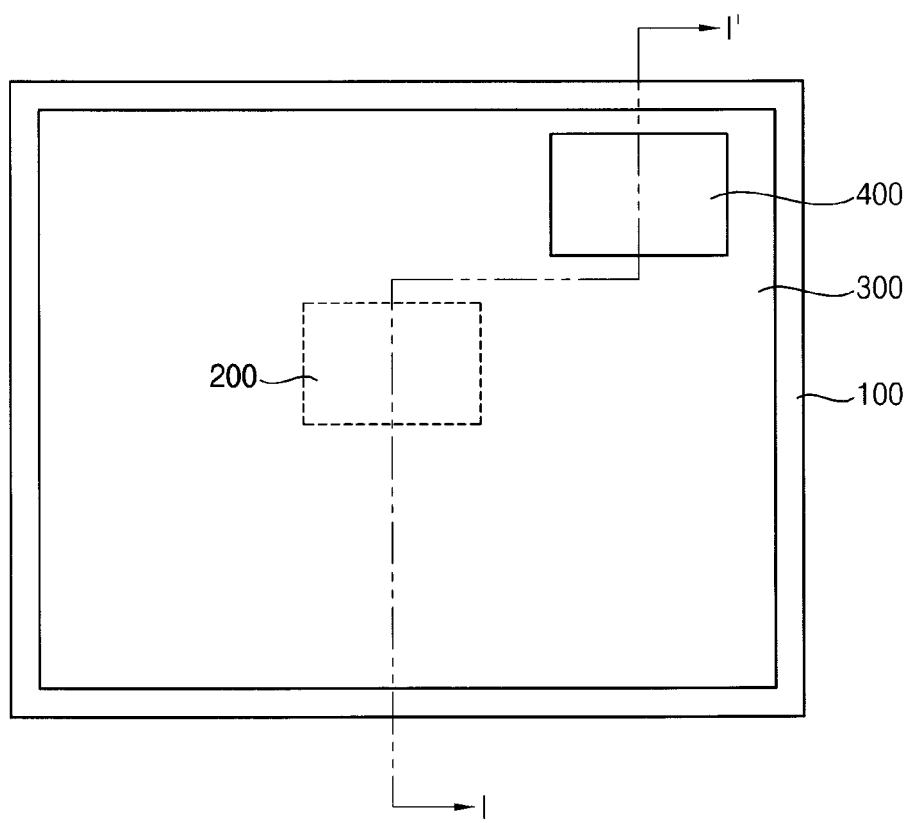
FIG. 1 is a plan view illustrating a semiconductor package usable with a mobile device according to an exemplary embodiment of the present inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
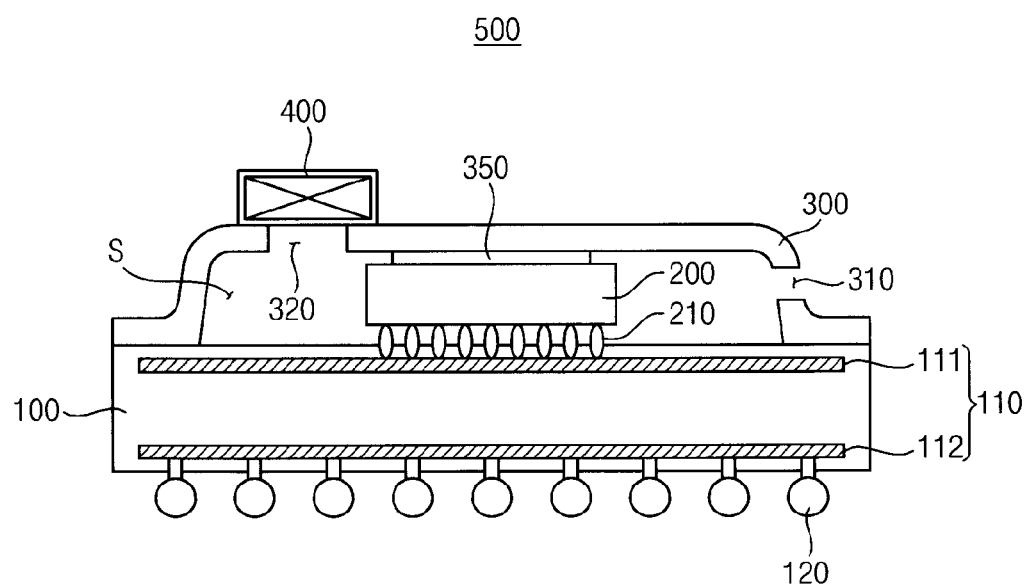
FIG. 2 is a cross-sectional view along a line I-I' of the semiconductor package of FIG. 1.
Figure 3:
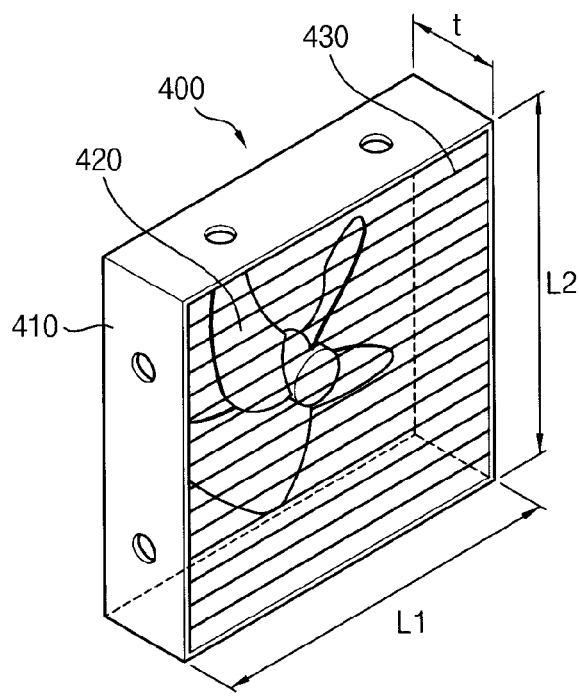
FIG. 3 is a perspective view illustrating an air flow generator of the semiconductor package of FIG. 1.

FIG. 1 is a plan view illustrating a semiconductor package usable with a mobile device according to an exemplary embodiment of the present inventive concept. FIG. 2 is a cross-sectional view along a line I-I' of the semiconductor package of FIG. 1. FIG. 3 is a perspective view illustrating an air flow generator of the semiconductor package of FIG. 1. In the present exemplary embodiment, a flip chip structure in which integrated circuit chips may be connected to a circuit board by penetration electrodes and a plurality of ball grid arrays (BGA) may be exemplarily disclosed as the semiconductor package of the mobile device (hereinafter, mobile semiconductor package). However, the present inventive concept is not limited thereto. The mobile device may include a mobile semiconductor package in which the integrated circuit chips may be connected to the circuit board by a lead frame process.

Referring to FIGS. 1 and 2, the mobile semiconductor package 500 in accordance with a first example embodiment of the present inventive concept may include an integrated circuit chip 200 mounted on a circuit board 100, a cover 300 covering the integrated circuit chip 200 and an air flow generator 1400 to generate air flow around the integrated circuit chip 200.

In an exemplary embodiment, the integrated circuit chip 200 may include a plurality of integrated circuit chips to be mounted on the circuit board 100 and to be electrically connected with each other by printed circuits of the board 100. Thus, an external electric source (not illustrated) may be connected to the printed circuits of the circuit board 100 and thus the integrated circuit chip 200 may be electrically connected to the external electric source by the circuit board 100. Therefore, various boards may be used as the circuit board 100 as long as the integrated circuit chip 200 can be stably mounted and the external electric source can be connected to the integrated circuit chip 200 with high reliability. For example, the circuit board 100 may include at least one of a tape circuit board, a printed circuit board and a ceramic board.

The circuit board 100 may include one or more conductive wirings 110 including an upper wiring 111 and a lower wiring 112. The upper wiring 111 may be electrically connected to an electrode pad of the integrated circuit chip 200 and the lower wiring 112 may be electrically connected to the external electrical source through a contact terminal 120.

The conductive wirings 110 may include a conductive metal pad and may be electrically connected to various electrical interconnects and also electrically connected to the electrode pad of the integrated circuit chip 200 and the contact terminal 120. The conductive wirings 110 may be arranged into a multilayer structure and may have various shapes according to the requirements of the semiconductor package 500. When the conductive wirings 110 is arranged in a plurality of different layers, the conductive wirings 110 may be interconnected with each other by a via electrode (not illustrated) such that the interconnected conductive wirings 110 can function as a single circuit.

The contact terminal 120 may include a plurality of ball pads arranged along a peripheral portion of a surface, for example, a rear surface, of the circuit board 100. The external electric source may be electrically connected to the integrated circuit chip 200 of the semiconductor package 500 and thus the external electric source and the semiconductor package 500 may be manufactured to be useable in various electronic systems. The ball pad may include one or more metal materials with good conductivity, such as aluminum (Al) and copper (Cu), and may be formed into a spherical shape by a reflow process. While the present example embodiment illustrates a ball pad as the contact terminal 120, other type or shape of contact members may also be used as the contact terminal 120 in place of or in conjugation with the ball pad according to connection modes between the semiconductor package 500 and the external electric source.

An insulation layer (not illustrated), such as photo solder resist, may be further arranged on a surface of the circuit board 100, and thus electrical interferences can be sufficiently minimized between the conductive wirings 110 and the integrated circuit chip 200 and the external electric sources on a surface, for example, a front surface or the rear surface, of the circuit board 110 can be electrically insulated from one another.

The integrated circuit chip 200 may include at least one semiconductor chip fabricated by a semiconductor device manufacturing process. Various integrated circuit chips 200 may be arranged on the circuit board 100 according to a user preference or requirement of the semiconductor package 500. For example, the integrated circuit chip 200 may include a memory unit such as DRAM devices and a flash memory devices and a process unit to perform a particular process according to a deriving program stored in a ROM device.

In the present exemplary embodiment, the integrated circuit chip 200 may be reversed or flipped toward a surface, for example, the front surface, of the circuit board 100, and thus an active surface of the integrated circuit chip 200 on which the electrode pad is arranged may face the front surface of the circuit board 100. A plurality of ball contacts may be arranged on the active surface of the integrated circuit chip 200 as a ball grid array 210, and thus the upper wiring 111 of the circuit board 100 may be connected to the integrated circuit chip 200 through the ball grid array (BGA) 210. That is, the integrated circuit chip 200 may have a flip chip structure in such a way that the active surface of the integrated circuit chip 200 may face the upper surface of the circuit board 100 and may make contact with the circuit board 100 through the BGA 210.

Otherwise, the integrated circuit chip 200 may be connected to the circuit board 100 by a lead frame process and thus the electrode pad of the integrated circuit chip 200 may be connected to the upper wiring 111 of the circuit board 100 by a bonding wiring.

While the present example embodiment discloses that the integrated circuit chip 200 includes a single chip, a plurality of chips may be provided as the integrated circuit chip 200. That is, the semiconductor package 500 may include a single chip on the circuit board 100 in view of a thickness and internal space of the mobile device. Thus, when the semiconductor package 500 is installed to other large-sized electronic systems, a plurality of chips may be arranged on the circuit board 100 according to requirements of the electronic system.

The cover 300 may cover the integrated circuit chip 200 and provide a flow space S around the integrated circuit chip 200. The cover 300 may be provided with at least one opening, and the flow space S may communicate with surroundings through the opening. In the present exemplary embodiment, a pair of first and second openings 310 and 320 may be provided to the cover 300.

For example, the cover 300 may be positioned on the circuit board 100 in such a configuration that the integrated circuit chip 200 on the circuit board 100 may be covered by the cover 300. In the present exemplary embodiment, the integrated circuit chip 200 may be arranged at a central portion of the circuit board 100 and the cover 300 may be secured to a peripheral portion of the circuit board 100 in such a way that the cover 300 may bulge out over the central portion of the circuit board 100. Thus, an ambient space around the integrated circuit chip 200 may be closed by the cover 300, to thereby form the flow space S around the integrated circuit chip 200 on the circuit board 100. The cover 300 may have a structure with a center portion and side portions extended downward from the center portion to provide a space to accommodate the integrated circuit 200 therein. The flow space S may be referred to as a closed flow space.

The first opening 310 may be provided at a side portion of the cover 300 and the second opening 320 may be provided at a top portion of the cover 300. External air may flow into or out of the flow space S through the first and the second openings 310 and 320 and thus the air may be compelled to flow around the integrated circuit chip 200 in the flow space S. As a result, the integrated circuit chip 200 may be cooled down due to the air flow in the flow space S.

In an exemplary embodiment, the cover 300 may include a metal flat having good thermal conductivity, and thus heat generated from the integrated circuit chip 200 may also be dissipated by thermal conduction through the cover 300 and the forced convection caused by the air flow in the flow space S, to thereby improve dissipation efficiency of the heat in the semiconductor package 500. For example, the cover 300 may include a metal having high thermal conductivity. Examples of the metal of high thermal conductivity include aluminum (Al), copper (Cu) and combinations thereof. The cover 300 may be modified in a shape and configuration in such a way that the surface of the integrated circuit chip 200 making contact with the air flow may be as large as possible in the flow space S within the limitations of installing requirements and usage surroundings of the semiconductor package 500, to thereby maximize the dissipation efficiency of the heat generated from the integrated circuit chip 200.

An adhesive 350 may be interposed between the integrated circuit chip 200 and the cover 300, and thus the cover 300 may be more stably secured to the circuit board 100. That is, the cover 300 may be secured to the peripheral portion of the circuit board 100 and the top surface of the integrated circuit chip 200, to thereby be secured to the circuit board 100 with high reliability in the semiconductor package 500. For example, the adhesive 350 may include a conductive epoxy resin and a conductive adhesive tape and thus the heat generated from the integrated circuit chip 200 may be efficiently dissipated out of the semiconductor package 500 by the thermal conduction through the adhesive 350.

The air flow generator 400 may be positioned on a surface of the cover 300 in relation to the first and the second openings 310 and 320 and thus may force the air to flow in the flow space S through the first and the second openings 310 and 320. In the present exemplary embodiment, the air flow generator 400 may be positioned on the top surface of the cover 300 over the second opening 320 and thus the air surrounding the semiconductor package 500 may be forced to flow into or out of the closed flow space S through the second opening 320. Thus, the air is forced to flow along the path across the second opening 320, the flow space S and the first opening 310. Accordingly, the heat generated from the integrated circuit chip 200 may be sufficiently dissipated outwards to surroundings. The first and the second openings 310 and 320 may function as inlet and outlet for the air flow in the flow space S.

A mini-blower may be used as the air flow generator 400 and the air flow may be generated by driving a fan of the mini-blower around the integrated circuit chip 200. In addition, an occupancy space of the air flow generator 400 may be minimized in the semiconductor package 500 due to a smaller size of the mini-blower. For example, the mini-blower usable with the air flow generator 400 may include a rotary fan, a rotary blower or a piezoelectric blower.

The integrated circuit chip 200 and/or the circuit board 100 may have one or more terminals to be connected to the air flow generator 400 through a conductive line, for example, a signal line and/or a power line, therebetween to transmit a signal and/or a power to control an operation of the air flow generator 400. The conductive line may be disposed inside of the semiconductor package 500. It is also possible that the signal and/or the power line may be disposed outside of the semiconductor package 500 to be connected to the air force generator 400 and at least one of the integrated circuit chip 200 and the circuit board 100.

FIG. 3 is view illustrating the air flow generator 400 of FIG. 2. The air flow generator may include the piezoelectric blower in the semiconductor package of FIG. 2. As illustrated in FIG. 3, the air flow generator 400 may include a rectangular box 410, a rotary fan 420 in the box 410 and a metal strap 430 arranged on front and rear surfaces of the box 410. The rotary fan 420 may force the air to flow in or out of the closed flow space S and thus the air may be forced to flow through the second opening 320. Accordingly, the compulsory air flow may be generated through the metal strap 430 and the second opening 320 by the rotary fan 420 of the piezoelectric blower.

The front surface of the box 410 may be disposed to face or overlap the second opening 320, and then the rotary fan 420 may be driven to rotate to thereby generate the compulsory air flow. The compulsory air flow may be transferred into the flow space S through the second opening 320 and finally to surroundings through the first opening 310. Thus, the air may be forced to flow into or out of the flow space S along a flow path of the first and the second openings, the flow space S and the metal strap 430 of the air flow generator 400.

In the present exemplary embodiment, the rectangular box 410 of the piezoelectric blower may have a latitudinal length L1 and a longitudinal length L2 of about 10 mm to about 20 mm and a thickness t of about 1.5 mm to about 3 mm, thereby minimizing the occupancy space of the air flow generator 400 in the semiconductor package 400. As a result, the size of the mobile device including the semiconductor package 500 may be sufficiently reduced.

In an exemplary embodiment, a control program to control the air flow generator 400 may be embedded into the integrated circuit chip 200 and a fan controller (not illustrated) may be further installed into the air flow generator 400. The fan controller may be driven by the control program and may drive the rotary fan 420 of the air flow generator 400. The fan controller may selectively control the rotary fan 420 according to operation conditions of the semiconductor package 500.

For example, a temperature sensor (not illustrated) may be provided with the integrated circuit chip 200 and is disposed adjacent to the integrated circuit chip 200 or disposed to contact the integrated circuit chip 200. The temperature sensor may detect a temperature thereof, for example, a surface temperature of the integrated circuit chip 200 periodically or constantly. When the detected surface temperature of the integrated circuit chip 200 may be higher than a given reference temperature, the fan controller may be allowed to operate. When the detected surface temperature is lower than the reference temperature, the fan controller may not be operated. Thus, the rotary fan 420 may be selectively driven according to the surface temperature of the integrated circuit chip 200. The selective operation of the air flow generator 400 may reduce the power consumption for driving the semiconductor package 500, to thereby save the energy of a battery pack for a mobile device including the semiconductor package 500.

Figure 4:
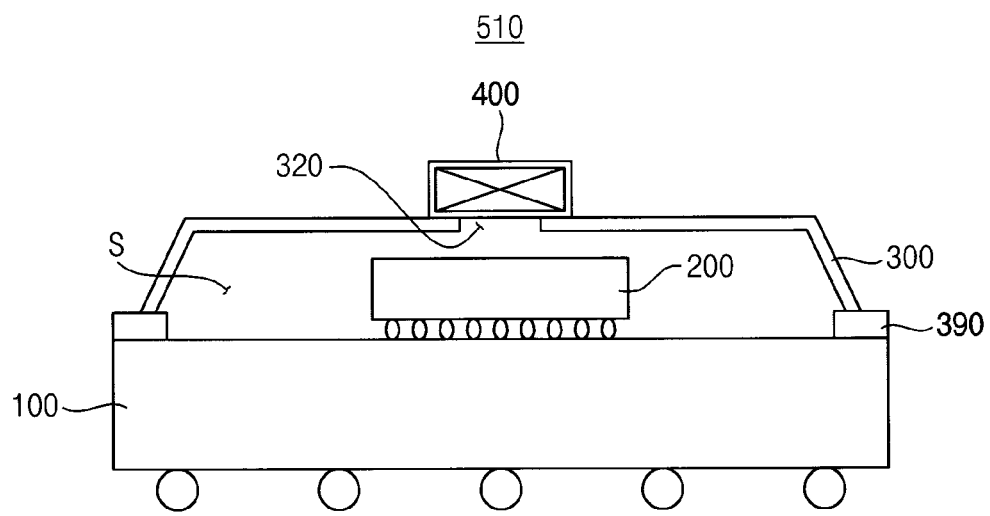
FIG. 4 is a cross-sectional view illustrating a semiconductor package according to an exemplary embodiment of the present general inventive concept.
Figure 5:
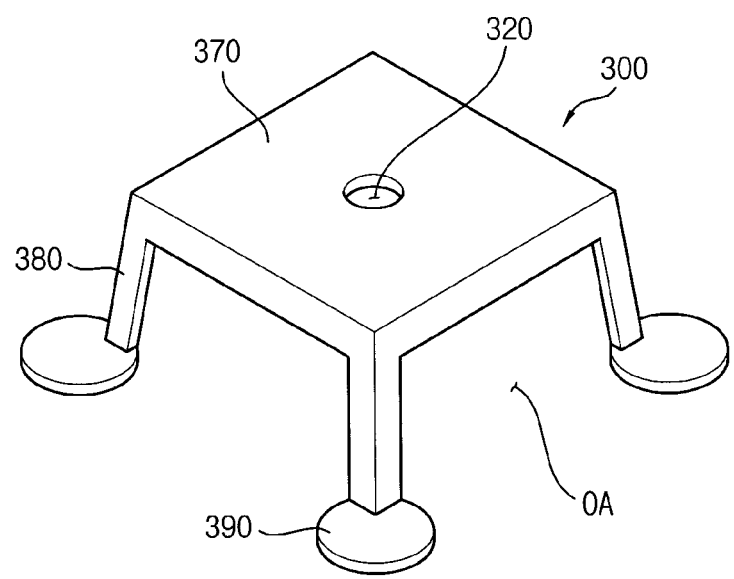
FIG. 5 is a perspective view illustrating a cover of the semiconductor package of FIG. 4.

FIG. 4 is a cross-sectional view illustrating a semiconductor package 510 according to an exemplary embodiment of the present general inventive concept, and FIG. 5 is a perspective view illustrating a cover of the semiconductor package of FIG. 4. The semiconductor package of FIG. 4 may have substantially the same structure as the semiconductor package of FIG. 2, except a shape and arrangement of the cover 300 thereof. In FIGS. 4 and 5, the same reference numerals denote the same elements of FIGS. 1 and 2.

Referring to FIGS. 4 and 5, the cover 300 covering the integrated circuit chip 200 may include a support 380 extending upwards from a securing portion 390 of the circuit board 100 at a corner portion thereof and an upper plate 370 supported by the support 380 and positioned over the integrated circuit chip 200.

For example, the upper plate 370 may have a size to substantially cover a unit area of the circuit board 100 at which the integrated circuit chip 200 may be positioned and may include the second opening 320 corresponding to the upper surface of the integrated circuit chip 200.

The support 380 may extend upwards from the securing portion of the circuit board 100 and may make contact with the upper plate 370 at an end portion thereof. Thus, a gap distance between the upper plate 370 and the circuit board 100 and/or a gap distance between the upper plate 370 and the integrated circuit chip 200 may be variable according to a height of the support 380. In the present exemplary embodiment, the support 380 may have the height higher than a thickness of the integrated circuit chip 200 and thus the upper plate 370 may be spaced apart from the upper surface of the integrated circuit chip 200. That is, a gap space may be provided between the upper surface of the integrated circuit chip 200 and the upper plate 370 and the gap space may communicate with the flow space S. The support 380 may be disposed perpendicular to the upper surface of the integrated circuit chip 200. It is possible that the support 380 may have an angle with a perpendicular line of the upper surface of the integrated circuit chip 200.

The securing portion 390 may be positioned on the circuit board 100 and may be arranged as a portion of the upper wiring 111 of the circuit board 100. For example, a portion of the upper wiring 111 may protrude from the front surface of the circuit board 100 and the protruding portion of the upper wiring 111 may function as the securing portion 390. Thus, the securing portion 390 may function as a ground pad or a contact pad and may include a solder bump, a conductive epoxy resin and an anisotropic conductor. In the present example embodiment, four securing portions 390 may be positioned at four corner portions of the unit area of the circuit board 100, respectively.

The upper plate 370 may be arranged on the support 380 in parallel with the circuit board 100 and the gap area between the neighboring supports 380 may be open, to thereby form an opening area OA between the neighboring supports 380. That is, no sidewall may be provided between the neighboring supports 380. Accordingly, the flow space S around the integrated circuit chip 200 under the upper plate 370 may be communicated with surroundings through the opening area OA.

The first opening 310 of FIG. 2 may be replaced with the opening area OA of FIG. 5, and thus the air around the integrated circuit chip 200 may be forced to flow through the second opening 320 and the opening area OA. When the air flow generator 400 may be positioned to cover the second opening 320, the compulsory air flow may be generated through the second opening 320. When the air flow generator 400 may force the air around the integrated circuit chip 200 to flow out of the flow space S, the surrounding air may flow into the flow space S from surroundings through the opening area OA. That is, the air may be compelled to flow into the flow space S through the opening area OA and to flow out of the flow space S through the second opening 320, thereby generate the compulsory air flow from the opening area OA to the second opening 320 via the flow space S around the integrated circuit chip 200. In contrast, when the air flow generator 400 may force the surrounding air to flow into the flow space S through the second opening 320, the air around the integrated circuit chip 200 may flow out of the flow space S to the surroundings through the opening area OA. That is, the air may be compelled to flow into the flow space S from surroundings through the second opening 320 and to flow out of the flow space S through the opening area OA, thereby generate the compulsory air flow from the second opening 320 to the opening area OA via the flow space S around the integrated circuit chip 200.

Therefore, the heat generated from the integrated circuit chip 200 may be transferred to the air in the flow space S, and the air around the chip 200 may be forced to flow outwards from the flow space S by the air flow generator 400. Thus, the heat generated from the integrated circuit chip 200 may be more efficiently dissipated outwards by an active air flow forced by the air flow generator 400 than by a passive air flow performed by the natural convention. Further, when the support 380 and the upper plate 370 may comprise a metal material having high thermal conductivity, the heat may be supplementary dissipated outwards by the thermal conduction through the support 380 and the upper plate 370.

According to the exemplary embodiment of the semiconductor package usable with the mobile device, the integrated circuit chip may be covered with the cover having an opening for air flow and the air flow generator may be positioned on the cover corresponding to the opening, and thus the air around the integrated circuit chip may be forced to flow into or out of the flow space through the opening by the air flow generator. Therefore, the heat generated from the chip 200 may be more efficiently dissipated to surroundings by the compulsory air flow or the active air flow than by the natural air flow or the passive air flow. In addition, when the cover may include a metal material having high thermal conductivity, the heat may also be dissipated to surroundings by the thermal conduction through the cover. When the mini-blower may be installed in the semiconductor package, the occupancy space for the semiconductor package may be minimized and thus the mobile device including the semiconductor package may be sufficiently downsized.

Further, when a control program is embedded into the integrated circuit chip as a program control unit, and a controller is installed to the air flow generator, the air flow generator may be controlled to selectively drive according to the surface temperature of the integrated circuit chip, thereby reducing the power consumption of the air flow generator and saving the energy of a battery pack for a mobile device including the semiconductor package.

Figure 6:
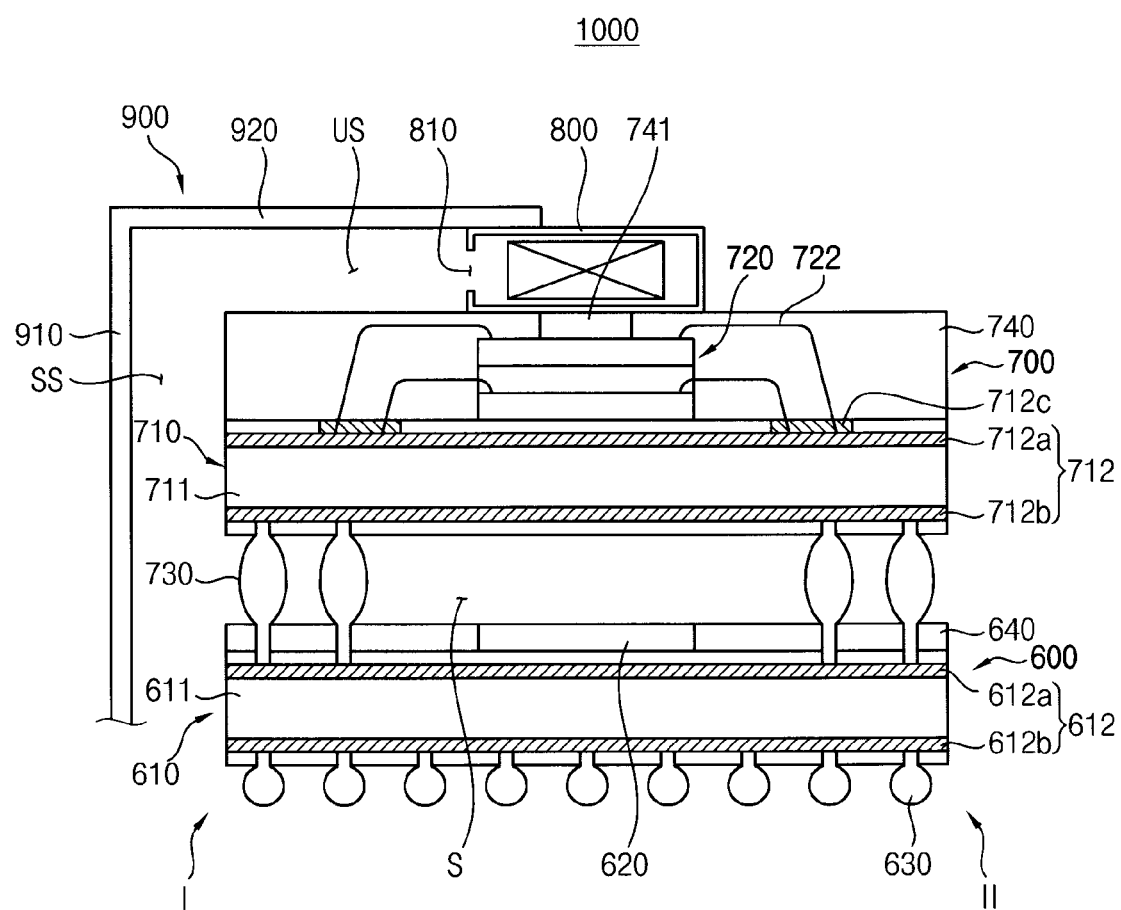
FIG. 6 is a cross-sectional view illustrating a semiconductor package usable with a mobile device according to an exemplary embodiment of the present inventive concept.

FIG. 6 is a cross-sectional view illustrating a semiconductor package usable with a mobile device according to an exemplary embodiment of the present inventive concept.

Referring to FIG. 6, the mobile semiconductor package 1000 according to the exemplary embodiment of the present inventive concept may include a first package 600, a second package 700 positioned on the first package 600, an air flow generator 800 positioned on the second package 700 and generating an active or a compulsory air flow and a flow guide 900 for guiding the active air flow along a desired path.

For example, the first package 600 may include a first circuit board 610 having a first board body 611 and a first conductive wiring 612 in the first board body 611, a first integrated circuit chip 620 positioned on a surface, for example, a front surface of the first circuit board 610 to contact or be electrically connected to the first conductive wiring 612 and a contact terminal 630 positioned on a surface, for example, a rear surface of the first circuit board 610 to contact or be electrically connected to the first conductive wiring 612.

For example, the first conductive wiring 612 may include a first upper wiring 612a arranged at an upper portion of the first board body 611 and a first lower wiring 612b arranged at a lower portion of the first board body 611. The first upper and lower wirings 612a and 612b may be electrically connected to each other by an internal plug (not shown). The first integrated circuit chip 620 may be electrically connected to the first upper wiring 612a and an external source such as a signal source and a ground source may be electrically connected to the first lower wiring 612b via the contact terminal 630.

The first integrated circuit chip 620 may be connected to the first upper wiring 612a via a ball grid array (BGA) structure a wire bonding structure. The contact terminal 630 may include a solder ball. An insulation layer (not illustrated) may be further provided on the rear surface of the first circuit board 610 and thus the neighboring contact terminals 630 may be electrically insulated from each other by the insulation layer. The first insulation chip 620 may include a chip scale package having a single chip and/or a multi stack package having a plurality of stacked chips.

The contact terminal 630 may include a plurality of solder balls or spherical metal bumps arranged along a peripheral portion of the rear surface of the first circuit board 610. An external electronic module may be electrically connected to the first integrated circuit chip 620 of the semiconductor package 1000 via the contact terminal 630. The solder ball and the metal bump may include a metal material having good electrical conductivity, such as aluminum (Al) and copper (Cu). The conductive metal contact terminal may have a shape of a sphere or a ball by a reflow process. Although the present exemplary embodiment illustrates the solder ball and the metal bump as the contact terminal 630, any other contact members may also be utilized in place of or in conjugation with the solder ball and the metal bump as long as the external electronic module can be electrically connected to the semiconductor package 1000.

A first sealing unit 640 may be selectively provided on the front surface of the first circuit board 610 in such a way that the first integrated circuit chip 620 and the front surface of the first circuit board 610 may be covered with the first sealing unit 640. Thus, the front surface of the first circuit board 620 may be sealed from surroundings and the first integrated circuit chip 620 and the first circuit board 610 may be prevented from external shocks, erosions and contacts. For example, the first sealing unit 640 may include an insulative resin or a semiconductor sealer such as an epoxy molding compound (EMC). The first sealing unit 640 may be partially removed from the front surface of the first circuit board 610, to thereby form a plurality of contact holes through which the first upper wirings 612a may be exposed to surroundings. Here, the surroundings are an outside of the first package 600 or an outside of the semiconductor package 1000.

For example, the second package 700 may include a second circuit board 710 having a second board body 711 and a second conductive wiring 712 in the second board body 711, a second integrated circuit chip 720 positioned on a surface, for example, a front surface of the second circuit board 710 to contact or be electonically connected to the second conductive wiring 712, and a connection terminal 730 positioned on a surface, for example, a rear surface of the second circuit board 710 to contact or be electrically connected to the first conductive wiring 612 of the first circuit board 610. The second package 700 may be spaced apart from the first package 600 and thus a gap space S may be provided between the first and the second packages 600 and 700.

For example, the second conductive wiring 712 may include a second upper wiring 712a arranged at an upper portion of the second board body 711 and a second lower wiring 712b arranged at a lower portion of the second board body 711. The second upper and lower wirings 712a and 712b may be electrically connected to each other by an internal plug (not illustrated). The second integrated circuit chip 720 may be electrically connected to the second upper wiring 712a, and the lower wiring 712b may be electrically connected to the first upper wiring 612a via the connection terminal 730. That is, the second integrated circuit chip 720 may be connected to the second conductive wiring 712, and the second conductive wiring 712 may be connected to the first conducive wiring 612 via the connection terminal 730, and thus the first and the second packages 600 and 700 may be connected to each other.

The second circuit board 710 may be spaced apart from the first package 600 by a gap distance d, and thus the gap space S may be provided between the rear surface of the second circuit board 710 and the active surface of the first integrated circuit chip 620. That is, the active surface of the first integrated circuit chip 620 may be exposed to the gap space S.

The second integrated circuit chip 720 may be connected to the second upper wiring 712a via a ball grid array (BGA) structure as a wire bonding structure. In the present exemplary embodiment, the second integrated circuit chip 720 may be connected to the second upper wiring 712a by a lead frame process, and thus a contact pad 712c to contact or be electrically connected to the second upper wiring 712a may be arranged at an upper portion of the second circuit board 710. The second integrated circuit chip 720 may be connected to the contact pad 712c by a bonding wire 722. It is possible that the second integrated circuit chip 720 can be connected to the second circuit board 710 by solder balls in place of the bonding wire 722.

The second integrated circuit chip 720 may include a chip scale package having a single chip or a multi stack package having a plurality of stacked chips. Although not illustrated, a multiple package having a plurality of stacked packages may also be positioned on the second circuit board 710 in place of the second integrated chip 720.

The first and second integrated circuit chips 620 and 720 may be variable according to requirement and performance of the semiconductor package 1000. When the mobile device including the semiconductor package 1000 needs to increase a memory size thereof, memory devices such as mobile DRAM devices and flash memory devices may be used as the first and the second integrated circuit chips 620 and 720. When the semiconductor package 1000 is used as a driving device in the mobile device or in other electronic appliances, a system memory device in which a driving program may be embedded may be used as the first and the second integrated circuit chips 620 and 720. In the present exemplary embodiment, the first integrated circuit chip 620 may include a system memory device having a driving program and various application programs and thus the mobile device including the semiconductor package 1000 may be operated by the driving program in the first integrated circuit chip 620. For example, the first package 600 may function as an application processor (AP) for the mobile device including the semiconductor package 1000. It is possible that the second integrated chip 720 can include a memory device that is connected to the first integrated circuit chip 620. For example, the second integrated circuit chip 720 may include an internal memory system to which the processed data in the AP may be stored.

The connection terminal 730 may make contact with the rear surface of the second circuit board 710 and the front surface of the first circuit board 610 through the gap space S. For example, the contact holes of the sealing unit 640 may be filled up with connection plugs and a plurality of solder balls or metal bumps making contact with the connection plugs, respectively, may be provided as the connection terminal 730. An additional insulation layer (not illustrated) may be further provided on the rear surface of the second circuit board 710 and thus the neighboring solder balls or the metal bumps may be electrically insulated from each other by the insulation layer.

A second sealing unit 740 may be selectively provided on the front surface of the second circuit board 710 in such a way that the second integrated circuit chip 720 and the front surface of the second circuit board 710 may be covered with the second sealing unit 740. Thus, the front surface of the second circuit board 720 may be sealed from surroundings and the second integrated circuit chip 720 and the second circuit board 710 may be prevented from external shocks, erosions and contacts. Here, the surroundings may be an outside of the second package 700 or an outside of the semiconductor package 1000.

The second sealing unit 740 may further include a dissipater 741 to dissipate the heat generated from the second integrated chip 720. For example, the second sealing unit 740 may be partially removed from the front surface of the second circuit board 710, thereby forming an opening through which the second integrated circuit chip 720 may be partially exposed. The dissipater 741 may be filled up into the opening and thus the heat generated from the second integrated circuit chip 720 may be dissipated outwards through the dissipater 741. A major portion of the heat may be dissipated from the chip 720 by the active air flow, as described hereinafter.

For example, the air flow generator 800 may be positioned on the second package 700 and generate a compulsory air flow through the gap space S that may function as the flow space of the semiconductor package 500 of FIG. 2.

Therefore, the front surface of the first integrated circuit chip 620 may make direct contact with the active air flow in the gap space S, to thereby improve the dissipation efficiency as compared when the heat is dissipated by the passive air flow based on natural air convention.

A mini-blower may be used as the air flow generator 800 and the active air flow may be generated by driving a fan of the mini-blower around the first and the second integrated circuit chips 620 and 720. In addition, the occupancy space of the air flow generator 800 may be minimized in the semiconductor package 1000 due to the small size of the mini-blower. For example, the mini-blower for the air flow generator 800 may include a rotary fan, a rotary blower and a piezoelectric blower.

The air flow generator 800 may have substantially the same structure as the air flow generator 400 of FIG. 3. The air flow generator 800 may include a side opening 810 at a side portion thereof and the air may flow into or out of the gap space S through the side opening 810. Thus, the compulsory air flow may be generated along the side opening 810 and the gap space S.

In the present exemplary embodiment, the air flow generator 800 may be positioned on the dissipater that may be inserted into the second sealing unit 740 and thus the heat dissipated by the dissipater from the second integrated circuit chip 720 may also be finally dissipated outwards by the air flow generator 800.

For example, the flow guide 900 may be positioned at a side portion of the first and the second packages 600 and 700 and may guide the air flowing in the gap space S to the air flow generator 800.

For example, the flow guide 900 may include a vertical portion 910 that may be spaced apart from the side portion of the first and the second packages 600 and 700 to thereby form a side space SS therebetween and a horizontal portion 920 that may extend horizontally toward the air flow generator 800 to thereby form an upper space US between the horizontal portion and the second sealing unit 740. In the present exemplary embodiment, the horizontal portion 920 may make contact with a top surface of the air flow generator 800 and thus the upper space US may communicate with the side opening 810 of the air flow generator 800.

That is, the gap space S may communicate with the side space SS at a first side portion I of the first and the second packages 600 and 700, and the side space SS may communicate with the upper space US that may communicate with the side opening 810 of the air flow generator 800. The gap space S may communicate with surroundings at a second side portion II of the first and the second packages 600 and 700. That is, the semiconductor package 1000 may communicate with the surroundings via the gap space S at the second side portion II. Thus, when the air flow generator 800 may be initiated by a controller of the semiconductor package 1000, the air may be forced to flow through the gap space SS, the side space SS and the upper space US.

When the air flow generator 800 may force the air to flow out of the semiconductor package 1000, the surrounding air may flow into the gap space SS from surroundings at the second side portion II of the semiconductor package 1000 and may be guided to sequentially flow toward the side space SS and the upper space US. Finally, the air may reach the side opening 810 of the air flow generator 800 and then may be discharged off to the surroundings. In such a case, the flow rate of the air may be determined by the speed of the rotary fan of the air flow generator 800.

Since the first integrated circuit chip 620 may be exposed into the gap space S, the active air flow may make a direct contact with the surface of the integrated circuit chip 620 and thus the heat generated from the first integrated circuit chip 620 may be efficiently dissipated by the compulsory air flow in the gap space S. Thus, the dissipation efficiency of the first integrated circuit chip 620 may be sufficiently improved due to the active air flow as compared with the conventional passive air flow caused by the natural air convection.

In the present exemplary embodiment, the first integrated circuit chip 620 may include a system process chip and the second integrated chip 720 may include a memory chip connected to the system process chip, and thus the first integrated circuit chip 620 may generate heat much more than the second integrated circuit chip 720. However, the first integrated circuit chip 620 may be sufficiently dissipated due to the active air flow in the gap space S although a larger amount of the heat may be generated from the first integrated circuit chip 620. The performance of the system processor chip may tend to increase as the performance of the mobile device may increase and thus the heat may tend to be generated from the system process chip more and more. In such a case, the active air flow may sufficiently dissipate the heat from the system processor chip, to thereby minimize the failure of the system process chip failure caused by the heat.

For example, the flow guide 900 may include a metal plate having good thermal conductivity and thus the heat may be further dissipated through the flow guide 900 when the air may flow through the side space SS and the upper space US.

Therefore, the heat generated from the first integrated circuit chip 620 may be dissipated mainly through the active air flow by the air flow generator 800 and the thermal conduction of the flow guide 900. The flow guide 900 may be installed on or supported by the semiconductor package 1000 or a frame of the mobile device. The semiconductor package 1000 may be disposed on a portion of frame of the mobile device.

In an exemplary embodiment, the semiconductor package 1000 may include a control program embedded into the first integrated circuit chip 620 as a program control unit to control the air flow generator 800, and a fan controller (not illustrated) installed into the air flow generator 800. The fan controller may be driven by the control program and may drive the rotary fan of the air flow generator 800. The fan controller may selectively operate the rotary fan according to an operation condition of the first package 600.

For example, a temperature sensor (not illustrated) may be provided to the first integrated circuit chip 620, and a surface temperature of the first integrated circuit chip 620 may be detected periodically or constantly. When the detected surface temperature of the first integrated circuit chip 620 is higher than a given reference temperature, the fan controller may be allowed to operate. When the detected surface temperature is lower than the reference temperature, the fan controller may not be operated. Thus, the rotary fan may be selectively driven according to the surface temperature of the integrated circuit chip 620. The selective operation of the air flow generator 800 may reduce the power consumption for driving the semiconductor package 1000, to thereby save the energy of a battery pack usable with a mobile device including the semiconductor package 1000.

According to the exemplary embodiment of the mobile semiconductor package, when an upper package and a lower package may be stacked and a gap space may be provided therebetween, a flow guide may be provided with a side portion of the semiconductor package and an air flow generator may be provided with a top portion of the semiconductor package. Thus, the side space and the upper space may be provided as flow path to the air flow generator and the air may be forced to flow sequentially through the gap space, the side space and the upper space by the air flow generator. Therefore, the integrated circuit chip exposed to the gap space may be sufficiently cooled down by the active air flow in the gap space, to thereby sufficiently increase the dissipation efficiency of the semiconductor package as compared with the case that the integrated circuit chip may be cooled down by the passive air flow. Particularly, when the mini-blower may be used as the air flow generator in the semiconductor package, the occupancy space for the semiconductor package may be reduced in the mobile device including the semiconductor package to thereby improve the space efficiency of the mobile device.

Further, when a control program may be embedded into the integrated circuit chip and a controller may be installed to the air flow generator, the air flow generator may be controlled to selectively drive according to the surface temperature of the integrated circuit chip, thereby reducing the power consumption of the air flow generator and saving the energy of a battery pack usable with a mobile device including the semiconductor package.

Figure 7:
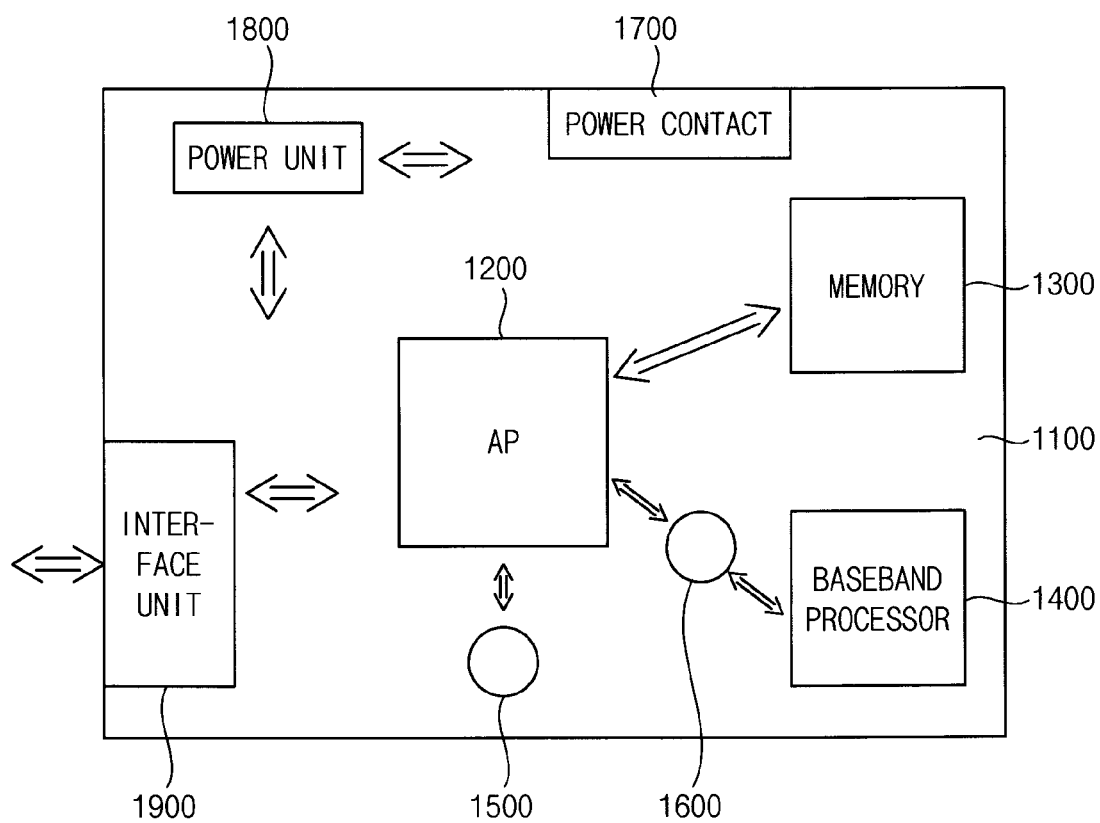
FIG. 7 is a structural view illustrating a process module including a semiconductor package according to an exemplary embodiment of the present general inventive concept.

FIG. 7 is a structural view illustrating a process module 2000 including a semiconductor package according to an exemplary embodiment of the present general inventive concept. the semiconductor package of FIG. 7 may be the semiconductor package 500 of FIG. 2. In FIG. 7, an application processor (AP) usable in a smart phone is exemplarily illustrated as the process module of the present example embodiment. However, the present example process module may be applied to any other process modules for small-sized mobile devices. The process module is disposed in a housing of a mobile device, for example, the smart phone or a tablet computer apparatus.

Referring to FIG. 7, the process module 2000 may include an AP 1200 to process signals, a memory unit 1300 to interactively transmit data with the AP 1200, a baseband processor (BP) 1400, a controller 1500, a process interconnector 1600 to transform signals between the AP 1200 and the BP 1400, a power connector 1700 and a base board 1100 on which the AP 1200, the memory unit 1300, the BP 1400, the controller 1500, the process interconnector 1600 and the power connector 1700 may be mounted. The process module may further include a power supply unit 1800 to supply power received through the power contact 1700 to components of the process module 2000, and a user interface 1900 to communicate with an external device to receive or transmit data and also to receive an input or command to control the components of the process module 2000.

For example, the base board 1100 may include a printed circuit board (PCB) such that the operation units of the AP 1200, the memory unit 1300, the BP 1400, the controller 1500, the process interconnector 1600 and the power connector 1700 may be mutually connected to one another through the PCB of the base board 1100. The operation units may be secured stably to the base board 1100. The operation units may be electrically connected with one another by the circuits of the base board 1100. Any other boards or substrates may be utilized as the base board 1100 as long as the operation units can be stably mounted onto the board or the substrate and electrically connected with one another.

The AP 1200 may include a central processing unit (CPU) for operating and executing instructions for driving the mobile device 2000, a first controller for controlling data communication between the CPU and the memory unit 1300 and a second controller for controlling data communication between the CPU and peripheral devices such as a printer and a display device.

Thus, the AP 1200 may include a plurality of operation chips corresponding to the CPU and a plurality of controller chips corresponding to the first and the second controllers. The operation chip and the controller chip may be assembled into a single chip scaled package and the single chip scaled package may be mounted on the circuit board and the air flow generator may be installed on the AP package in the same way as or similar way to the semiconductor package 500 of FIG. 2. Thus, the heat caused by the operation of the operation chip and the controller chip may be sufficiently dissipated outwards through the active air flow by the air flow generator, not through the passive air flow, and thus the AP 1200 may be sufficiently prevented from being damaged by the heat. Therefore, the operation failure of the mobile device 2000 caused by the AP defect may be remarkably prevented due to the sufficient dissipation of the heat. Furthermore, although the speed and performance of the AP 1200 may increase corresponding to the need of high performance of the mobile device 2000 and thus much more heat may be generated from the AP 1200, the AP 1200 may be sufficiently cooled down by the active air flow.

In addition, a control program may be embedded into the AP 1200, and a controller driven by the control program may be installed to the air flow generator, and thus the air flow generator may be controlled to be selectively operated according to a temperature, for example, the surface temperature of the chips in the AP 1200, thereby reducing the power consumption of the air flow generator and saving the energy of a battery pack for the mobile device 2000 including the AP 1200.

The data processed in the AP 1200 may be transferred to and stored in the memory unit 1300. In addition, the data in the memory unit 1300 may also be transferred to the AP 1200. While the present embodiment illustrates that the AP 1200 and the memory unit 1300 may be arranged in parallel with each other on the base board 1100, any other arrangements may be allowable between the AP 1200 and the memory unit 1300 according to the mobile device 2000. For example, the AP 1200 and the memory unit 1300 may be assembled into a single package in the same way as or similar way to the semiconductor package 1000 of FIG. 6. In such a case, the memory unit 1300 may not be mounted on the base board 1100.

The BP 1400 may perform a wireless communication between a base station and the mobile device 2000 and thus may transmit/receive various data such as sound data and wireless internet data to/from the base station. The received data may be processed in the AP 1200 and may be selectively stored into the memory unit 1300. The process interconnector 1600 may be interposed between the AP 1200 and the BP 1400, and thus different kinds of the data may be transferred between the AP 1200 and the BP 1400.

The controller 1500 may include a various kinds of audio codes and an input controller for a touch panel and thus may control the AP 1200 to process various data such as music data and moving image data and may transfer a touch signal of the touch panel into the AP 1200 as a user input or command.

The power connector 1700 may be connected to a battery pack built in the mobile device 2000 and may apply electrical power to each of the operation units.

Accordingly, the air flow generator may be mounted on the semiconductor package including the driving processor and thus the heat generated from the semiconductor package may be sufficiently dissipated by the active air flow. Accordingly, although the speed and performance of the driving processor may increase corresponding to the need of high performance of the process module and thus much more heat may be generated from the driving processor, the driving processor may be sufficiently cooled down by the active air flow to thereby prevent the failures of the process module due to the heat of the driving processor.

According to exemplary embodiments of the present inventive concept, an air flow generator may be positioned on the semiconductor package and thus the heat generated from the semiconductor package may be sufficiently dissipated out of the semiconductor package by the active air flow and the semiconductor package may be efficiently cooled down. The mini-blower to generate a compulsory air flow by rotating a fan may be used as the air flow generator so as to reduce the occupancy space, and thus the occupancy space for the semiconductor package may be minimized in the mobile device including the semiconductor package. Further, the air flow generator may be selectively operated in accordance with the surface temperature of the integrated circuit chip of the semiconductor package, thereby reducing the power consumption of the air flow generator and saving the energy of a battery pack usable with a mobile device including the semiconductor package.

According to exemplary embodiments of the present inventive concept, an air flow generator is arranged on a semiconductor package and the air around the semiconductor package is forced to flow and thus the heat can be efficiently dissipated outwards from the chips of the semiconductor package. A mini-blower for blowing ambient air by a small fan may be used as the air flow generator and thus the occupation space for the semiconductor package including the mini-blower may be minimized in the mobile device. Further, the air flow generator may be selectively operated according to the temperature of integration circuit chips in the semiconductor package, to thereby minimize the power consumption for the air flow generator in the mobile device.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor package usable with a mobile device, comprising:
   a circuit board including conductive wirings therein and contact terminals on a rear surface thereof;
   an integrated circuit chip positioned on a front surface of the circuit board and electrically connected to the conductive wirings;
   a cover including at least an opening, and to cover the integrated circuit chip such that a flow space is provided around the integrated circuit chip and the opening communicates with the flow space;
   an air flow generator positioned on the cover to generate a compulsory air flow through the flow space and the opening to dissipate heat out of the semiconductor package from the integrated circuit chip by the compulsory air flow;
   a control program, that is activated based on a surface temperature of the integrated circuit chip with respect to a reference temperature, being embedded into the integrated circuit chip; and
   a controller driven by the control program and installed in the air flow generator such that the air flow generator is controlled to be operated in response to the surface temperature of the integrated circuit chip being higher than the reference temperature.

2. The semiconductor package of claim 1, wherein the integrated circuit chip include a flip chip structure in which an active surface of the integrated circuit chip faces a front surface of the circuit board and an electrode pad on the active surface of the integrated circuit chip is connected to the conductive wirings on the front surface of the circuit board by a ball grid array (BGA) and further comprises a dissipater interposed between the integrated circuit chip and the cover.

3. The semiconductor package claim 2, wherein:
   the cover includes first and second openings through which surrounding air flows into or out of the flow space; and
   the air flow generator is positioned on one of the first and second openings.

4. The semiconductor package claim 2, wherein the air flow generator comprises a rotary fan, a rotary blower, or a piezoelectric blower.

5. The semiconductor package of claim 2, further comprising:
   an adhesive interposed between the integrated circuit chip and the cover such that the dissipater is positioned in the adhesive.

6. The semiconductor package of claim 1, wherein the air flow generator comprises a housing such that a length of the housing of the air flow generator is less than half a length of the cover.

7. The semiconductor package of claim 1, wherein the air flow generator is centered over the opening.

8. The semiconductor package of claim 1, wherein the cover comprises a first end, a center, and a second end, and the opening is located at the second end of the cover opposite the first end.

9. The semiconductor package of claim 1, wherein the generated compulsory air is generated to flow from one end of the circuit board to an end opposite the one end of the circuit board.

10. A semiconductor package usable with a mobile device, comprising:
    a first package including a first circuit board having first conductive wirings, a first integrated circuit chip on a front surface of the first circuit board and a contact terminal on a rear surface of the first circuit board, the first integrated circuit chip and the contact terminal being connected to the first conductive wirings;
    a second package spaced apart from the first package to thereby provide a gap space therebetween and including a second circuit board having second conductive wirings and a second integrated circuit chip on a front surface of the second circuit board, the second integrated circuit chip being connected to the second conductive wirings;
    an air flow generator to generate a compulsory air flow through the gap space; and
    a flow guide positioned at a first side of the first and the second packages to guide the compulsory air flow to a direction of the semiconductor package.

11. The semiconductor package of claim 10, wherein the first integrated chip includes an application processor to operate instructions and to process data, and the second integrated chip includes a memory chip to store the data processed in the application processor.

12. The semiconductor package of claim 11, wherein the first and the second integrated chips include a plurality of chips, respectively, so that the first and the second packages includes a multi stack package, respectively.

13. The semiconductor package of claim 10, wherein:
    the air flow generator is positioned on the second package; and
    the flow guide includes a vertical portion that may be spaced apart from the first side of the first and the second packages to thereby form a side space there between and a horizontal portion that may extend horizontally toward the air flow generator to thereby form an upper space (US) between the horizontal portion and the second package.

14. The semiconductor package of claim 13, wherein the air flow generator includes a rotary fan, a rotary blower or a piezoelectric blower.

15. The semiconductor package of claim 10, wherein the flow guide includes a metal plate having high thermal conductivity.

16. The semiconductor package of claim 15, wherein the metal plate comprises any one material selecting from a group consisting of aluminum (Al), copper (Cu) and combinations thereof.

17. The semiconductor package of claim 10, further comprising:
    at least a connection terminal making contact with both of the first conductive wirings and the second conductive wirings through the gap space.

18. The semiconductor package of claim 10, wherein the semiconductor package further comprises:
    a control program that is activated based on a surface temperature of the first integrated circuit chip with respect to a reference temperature is embedded into the first integrated circuit chip; and a controller driven by the control program and installed in the air flow generator such that the air flow generator is controlled to be operated on condition that the surface temperature of the first integrated circuit chip is over the reference temperature.

19. A semiconductor package usable with a mobile device, comprising:

a package including a circuit board having conductive wirings, an integrated circuit chip on a front surface of the circuit board, a contact terminal on a rear surface of the circuit board, the integrated circuit chip and the contact terminal being connected to the conductive wirings, and a cover disposed to cover the integrated circuit chip and to form a gap space therebetween;

an air flow generator disposed to generate a compulsory air flow through the gap space in the package;

a program control unit disposed in at least one of the circuit board and the integrated circuit chip to generate a control signal; and a controller disposed in the air flow generator to receive the control signal to control an operation of the air flow generator.

20. The semiconductor package of claim 19, wherein:

the cover includes one or more securing portions disposed on the circuit board, one or more supports extended from the corresponding securing portions away from the circuit board, and a plate connected to the supports to cover the integrated circuit chip and having at least one opening; and the air flow generator is disposed on the cover to communicate with the opening.

21. A mobile device having the semiconductor package of claim 19.

* * * * *